(12) United States Patent
Jiang et al.

(10) Patent No.: US 7,160,417 B2
(45) Date of Patent: Jan. 9, 2007

(54) CASSETTE FOR A LOAD-LOCK

(75) Inventors: I-Tang Jiang, Tainan County (TW);
Yu-Ling Peng, Hsinchu County (TW);
Kuo-Shun Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 312 days.

(21) Appl. No.: 10/707,706

(22) Filed: Jan. 6, 2004

(65) Prior Publication Data

US 2004/0226517 A1   Nov. 18, 2004

(30) Foreign Application Priority Data

May 14, 2003   (TW) ................ 92113046 A

(51) Int. Cl.
*C23F 1/00*     (2006.01)
*C23C 16/00*    (2006.01)
*B65G 1/133*    (2006.01)
*B65D 85/00*    (2006.01)
*B65D 6/40*     (2006.01)

(52) U.S. Cl. .................. 156/345.31; 156/345.51; 118/728; 118/500; 414/217.1; 414/331.01; 414/935; 206/710; 206/711; 220/661

(58) Field of Classification Search ........ 414/935–941, 414/266, 267, 940, 331.01; 220/661; 118/719; 156/345.31, 345.32
See application file for complete search history.

(56) References Cited

U.S. PATENT DOCUMENTS

| | | | |
|---|---|---|---|
| 5,346,518 A * | 9/1994 | Baseman et al. | 96/126 |
| 5,638,958 A * | 6/1997 | Sanchez | 206/710 |
| 6,540,467 B1 * | 4/2003 | Zohni et al. | 414/275 |

* cited by examiner

*Primary Examiner*—Karla Moore
(74) *Attorney, Agent, or Firm*—Jiang Chyun IP Office

(57) ABSTRACT

A cassette for holding substrate in a load-lock comprising an outer casing having a front surface with multiple slots and two sidewalls having holes at the bottom section thereof. Braces are set at the corner edges inside the outer casing and side plates are attached to the braces. Each slot has a set of side plates attached to the braces for holding a substrate. Obstruction pieces are also set inside the outer casing near the corresponding holes. Each obstruction pieces comprise a fixed part and an obstructing part. The fixed part attaches firmly to a bottom plate of the outer casing, and the obstructing part blocks the corresponding hole on the outer casing.

7 Claims, 4 Drawing Sheets

CASSETTE FOR A LOAD-LOCK

CROSS REFERENCE TO RELATED APPLICATIONS

This application claims the priority benefit of Taiwan application serial no. 92113046, filed on May 14, 2003.

BACKGROUND OF INVENTION

1. Field of the Invention

The present invention relates to a cassette. More particularly, the present invention relates to a cassette for holding substrates inside a load-lock.

2. Description of the Related Art

In general, in a fabrication of a semiconductor product or an electro-optical device, a number of processing steps must be performed with some of the processing steps being performed in a vacuum state. To prevent a reaction chamber from getting exposed to air, a wafer or substrate undergoing a reaction in a vacuum state is often placed inside a load-lock first. The load-lock is a special area where wafers or substrates are free to move in and out of the reaction chamber without exposing the reaction chamber to the atmosphere. A trap door is normally installed somewhere before or after the entrance to the reaction chamber so that the reaction chamber is always maintained in a vacuum state through the trap door and a vacuum exhaust system.

Inside the load-lock, the substrates or wafers that require to be processed with a vacuum reaction are placed inside a substrate cassette or a wafer cassette. In order to carry out the reaction, a robotic arm retrieves a substrate or a wafer from the substrate cassette or the wafer cassette and then transports it to the reaction chamber one at a time.

FIG. 1 is a schematic diagram showing the design of a conventional cassette inside a load-lock. As shown in FIG. 1, the outer portion of the cassette is labeled 10 and the inner portion of the cassette is labeled 20. The cassette comprises an outer casing 102, a plurality of braces 106 and a plurality of side plates 108.

A front surface 140 of the outer casing 102 of the cassette has a plurality of slots 100 for inserting substrates into and for retrieving substrates out of the cassette. In most optoelectronic manufacturing facilities, each cassette has 12 slots 100 for holding 12 pieces of substrate.

In the interior 20 of the cassette, there are four braces 106 and a plurality of side plates 108. The braces 106 are positioned at the four edge corners of the outer casing 102 and the side plates 108 are fastened to the braces 106. For each slot 100, all four braces 106 have a side plate 108. In other words, each slot 100 has four corresponding side plates 108 for supporting a substrate 200 (as shown in FIG. 2).

Furthermore, as shown in FIG. 3, there are four rectangular holes 104 at the bottom section of two sidewalls 130a, 130b of the outer casing 102. These rectangular holes 104 are designed to facilitate a tool to enter into the interior of the cassette and fasten the horizontal screws.

FIG. 4 is a sketch showing the side plate latching onto the bottom section of the outer casing inside the rectangular hole. After a substrate is processed and sent back to the cassette inside the load-lock, the robotic arm will move into the cassette to retrieve another substrate for processing. However, due to thermal suction and vacuum electrostatic effect, the side plate 108 is often sucked up by the substrate 200. The sucked-up side plate 108 may easily lodge inside the rectangular hole 104 at the bottom section of the sidewalls 130a, 130b. When the robotic arm tries to retrieve a substrate 200 from the cassette, the substrate 200 may collide with the stuck side plate 108 inside the rectangular hole 104 leading to some damages. Such occurrences will obstruct production resulting in a drop in productivity. Since the rectangular holes 104 are formed on the bottom section of the sidewalls 130a, 130b of the outer casing 102, the lodging of the side plate 108 within the rectangular hole 104 mostly occurs when a substrate is retrieved from the slot 100 at the very bottom of the cassette.

SUMMARY OF INVENTION

Accordingly, one object of the present invention is to provide a cassette for a load-lock that prevents the side plate of a conventional cassette from lodging into a corresponding rectangular hole to damage a substrate.

To achieve these and other advantages and in accordance with the purpose of the invention, as embodied and broadly described herein, the invention provides a cassette for a load-lock. The cassette comprises an outer casing, a plurality of horizontal screw sets, a plurality of braces, a plurality of side plates and a plurality of obstruction pieces. A front surface of the sides of the outer casing has a plurality of slots. Two sidewalls of the outer casing have a plurality of holes at a bottom section thereof. Each set of horizontal screws engages with the bottom plate of the outer casing near the corresponding hole. The interior of the outer casing further comprises a plurality of braces and a plurality of side plates. The braces are positioned at the corner regions inside the outer casing. The side plates are fastened to the braces, wherein the side plates are attached to the braces at a position corresponding to each slot. Moreover, all the side plates corresponding to the same slot are set on a horizontal plane so that a substrate can be placed horizontally inside the cassette. In other words, the edges of a substrate will be supported through all the side plates at the same level after the substrate is inserted into the cassette through the slot. The cassette of this invention further includes a plurality of obstruction pieces. The obstruction piece is positioned inside the outer casing corresponding to the holes at the bottom section of the sidewalls of the outer casing. Each obstruction pieces comprises a fixed part and an obstructing part. The fixed parts attach to the bottom plate of the outer casing, and the obstructing parts blocks the corresponding holes. With the obstructing parts blocking the holes, the side plate can no longer be jammed into the hole. It should be noted that the method of attaching the fixed part of the obstruction piece to the bottom plate of the outer casing includes putting horizontal screws through the fixed part before tightening up the screws to the bottom plate of the outer casing.

In this invention, the holes at the bottom section of the two sidewalls of the outer casing are blocked through obstruction pieces. This prevents the side plate from being sucked up by the substrate due to thermal suction or vacuum electrostatic effect from getting lodged inside the hole to cause some damage to the substrate.

When the side plate is sucked up by the substrate due to thermal suction or electrostatic effect, the side plate will collide with the obstruction piece and the return to its original location. Hence, the side plate is prevented from lodging inside the hole to cause a tear in the substrate when the substrate is fetched from the cassette.

In brief, the cassette is able to hold substrates inside the load-lock with minimal damage. Therefore, product quality is improved and yield is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
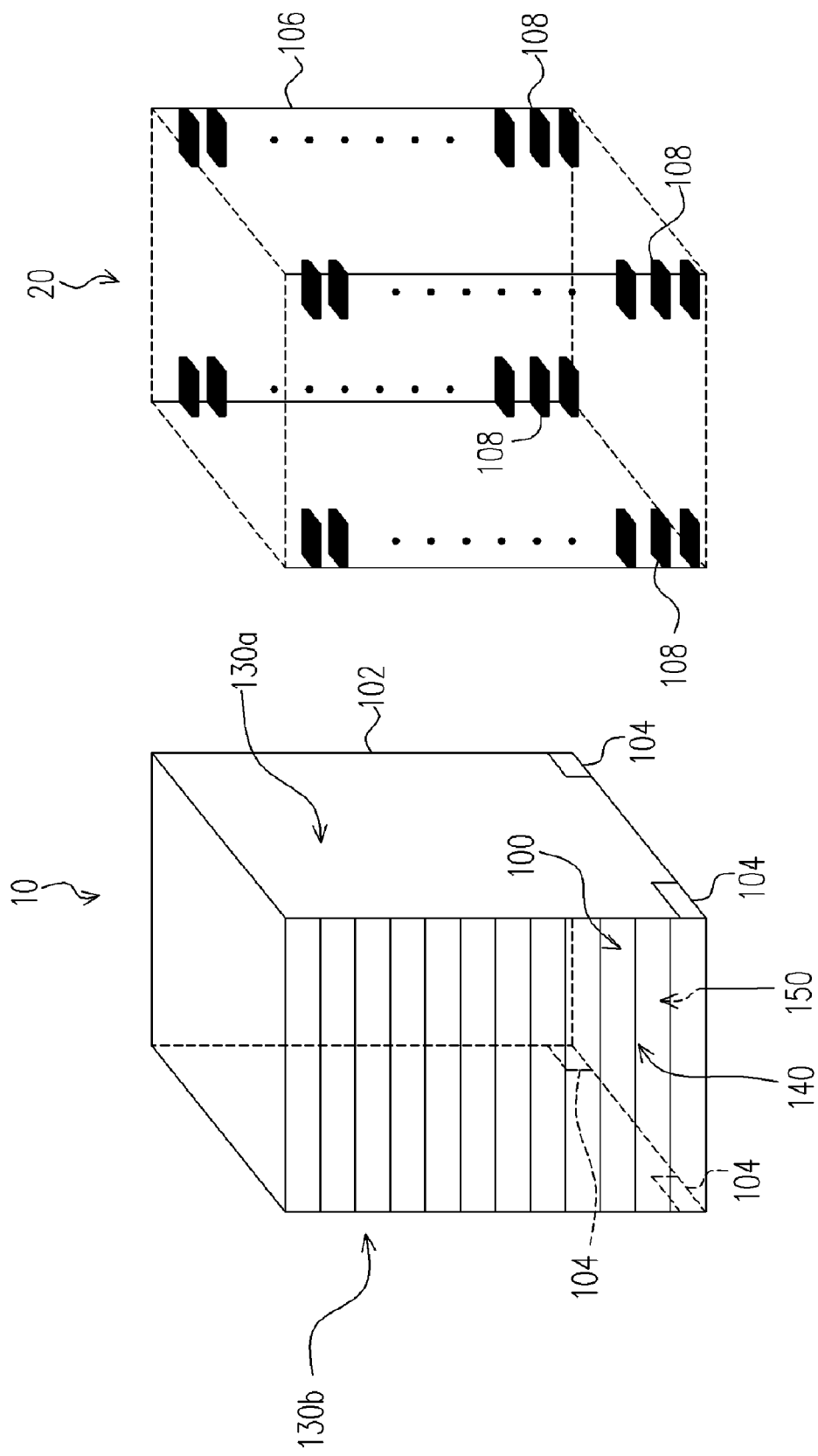
FIG. 1 is a schematic diagram showing the design of a conventional cassette inside a load-lock.

Reference will now be made in detail to the present preferred embodiments of the invention, examples of which are illustrated in the accompanying drawings. Wherever possible, the same reference numbers are used in the drawings and the description to refer to the same or like parts.

Figure 5:
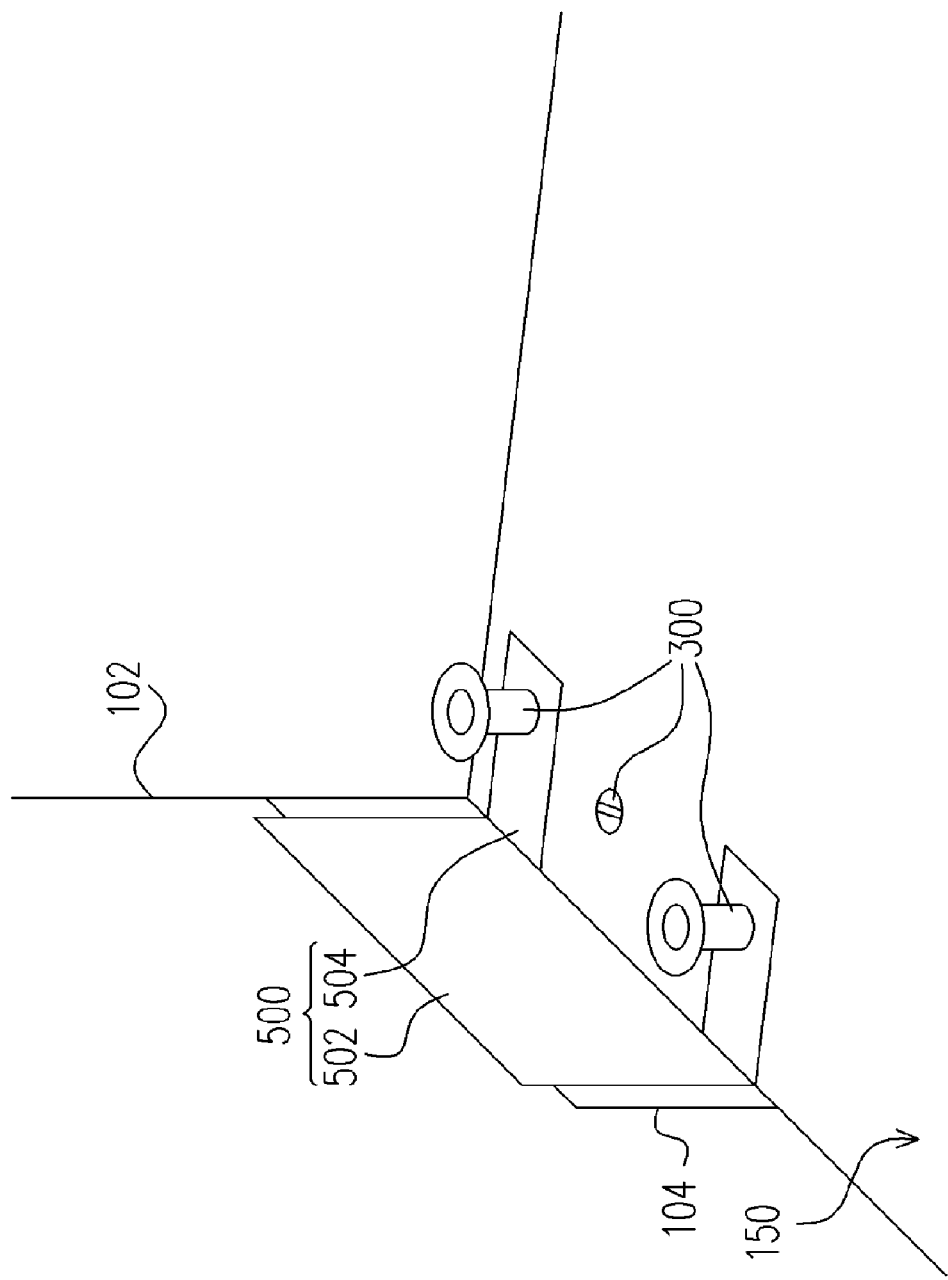
FIG. 5 is a schematic diagram showing an obstruction piece blocking a rectangular hole to prevent the lodging of a side plate within the hole according to one preferred embodiment of this invention.

FIG. 1 is a schematic diagram showing the design of a conventional cassette inside a load-lock. FIG. 5 is a schematic diagram showing an obstruction piece blocking a rectangular hole to prevent a side plate from lodging in the hole according to one preferred embodiment of this invention. As shown in FIGS. 1 and 5, the cassette for holding substrate inside a load-lock comprises an outer casing 102, a plurality of horizontal screw sets 300, a plurality of braces 106, a plurality of side plates 108 and a plurality of obstruction pieces 500. In FIG. 1, the outer portion of the cassette is labeled 10 while the inner portion of the cassette is labeled 20.

Figure 3:
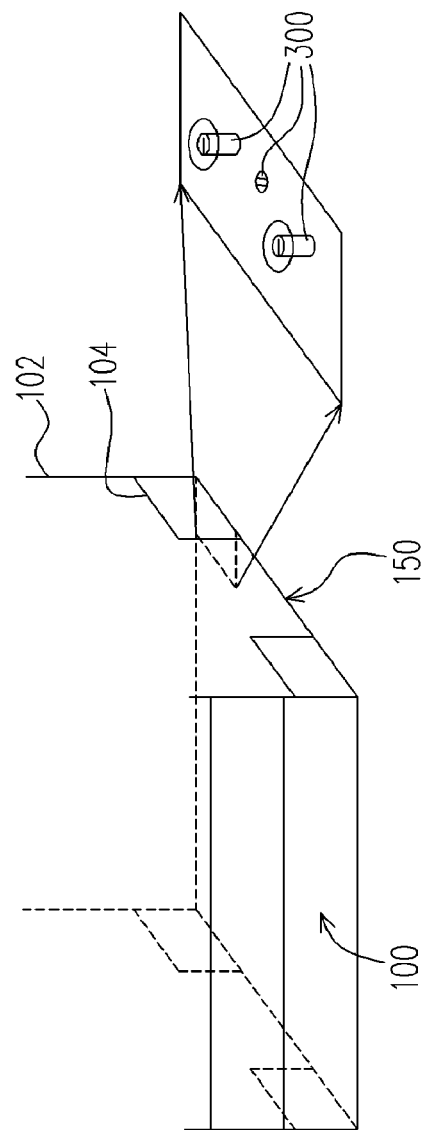
FIG. 3 is a diagram showing rectangular holes on the lower side surface of the cassette.
Figure 4:
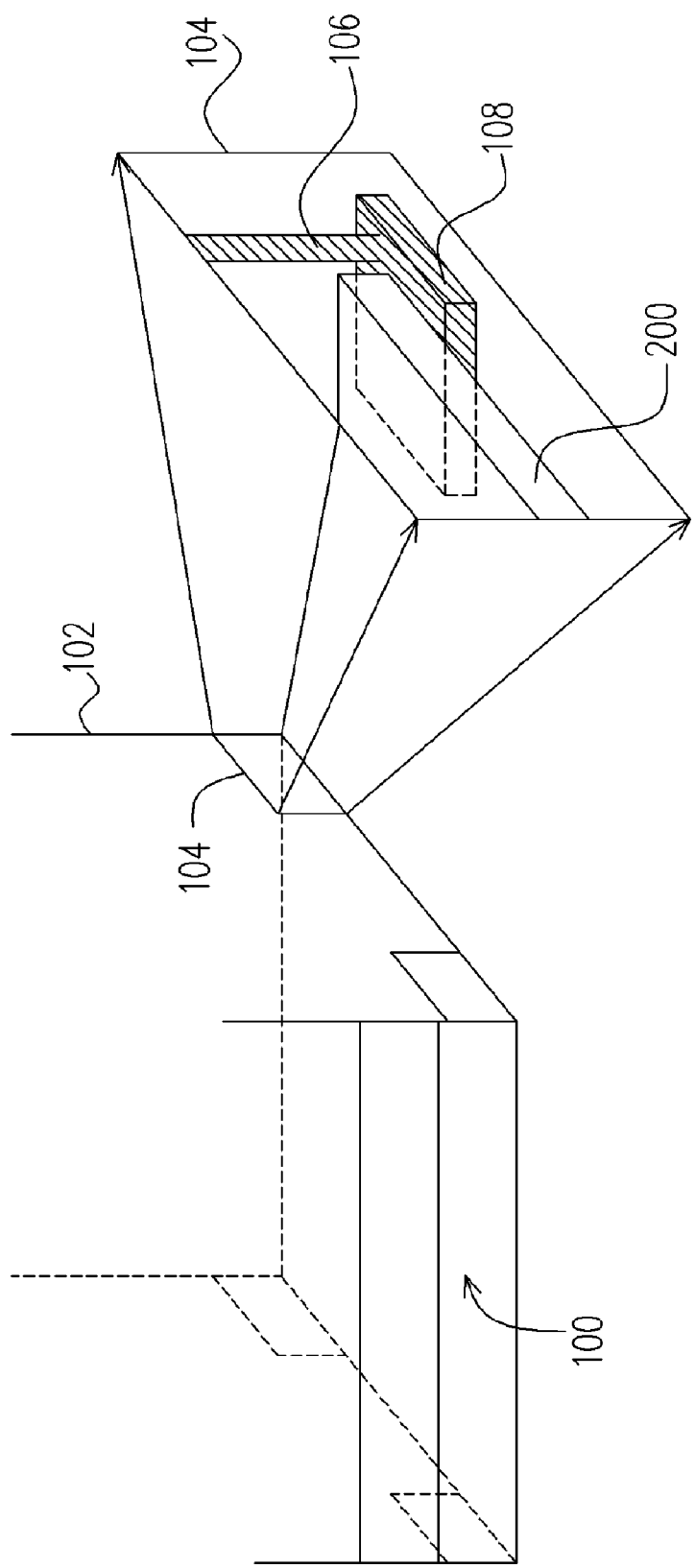
FIG. 4 shows the lodging of a side plate within the rectangular hole on the side of the outer casing.

The outer casing 102 of the cassette has a front surface 140 having a plurality of slots 100, and the outer casing 102 has two sidewalls 130a, 130b having four holes 104, such as rectangular holes, at a bottom section thereof. Each horizontal screw set 300 is tightly engaged to the outer casing 102 inside the hole 104, as shown in FIG. 3. In this embodiment, the outer casing 102 has altogether 12 slots. Hence, the cassette is to hold a maximum of 12 substrate pieces.

The slots 100 on the outer casing 102 facilitate the insertion of substrates into and out of the cassette through a robotic arm. The four holes 104 on bottom section of the two sidewalls 130a, 130b of the outer casing 102 facilitate the moving of horizontal screws 300 into the interior and tightening the screws 300 onto a bottom plate 150 of the outer casing 102, as shown in FIG. 3.

The interior 20 of the cassette has a plurality of braces 106 and side plates 108. The braces 106 are positioned at the respective corner edges of the outer casing 102 and the side plates 108 are fastened to the braces 106. Each slot 100 has a set of side plates 108 attached to their corresponding braces 106 for supporting a substrate.

Figure 2:
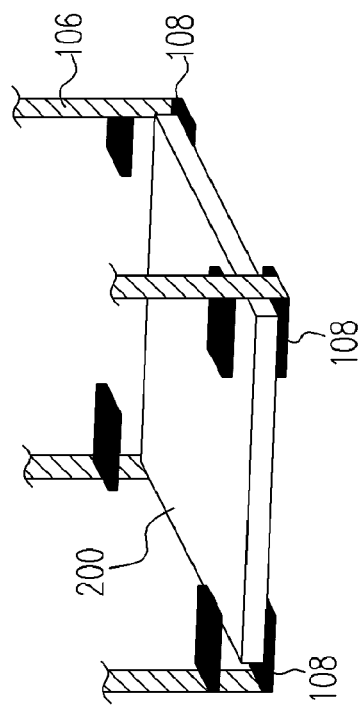
FIG. 2 is a diagram showing a substrate resting on side plates inside a cassette.

In this embodiment, each of the four corners inside the outer casing 102 has a brace 106. A side plate 108 is attached to each brace 106 to correspond with each slot 100. Hence, there are four side plates 108 located at the same horizontal plane as the slot 100 for holding a substrate 200 (as shown in FIG. 2). In other words, the corners of a substrate 200 will rest on the respective side plates 108 on the same plate after the substrate 200 is inserted into the interior of the cassette through the slot 100.

In addition, the cassette further comprises an obstruction piece 500 set inside the outer casing 102 corresponding to the hole 104 at the bottom section of the sidewalls 130a, 130b. Each obstruction piece 500 has a fixed part 504 and an obstructing part 502 (as shown in FIG. 5). The fixed part 504 of the obstruction piece 500 is firmly attached to the bottom plate 150 of the outer casing 102. The obstructing part 502 of the obstruction piece 500 blocks up the corresponding hole 104 and prevents the side plate 108 from lodging inside the hole 104. In this embodiment, the obstruction piece 500 is L-shaped, for example.

It is to be noted that the method of attaching the fixed part 504 of the obstruction piece 500 to the bottom plate 150 of the outer casing 102 includes putting horizontal screws 300 through the fixed part 504 before tightening up the screws to the bottom plate 150 of the outer casing 102. In other words, the process of tightening the horizontal screws 300 inside the casing 102 through the hole 104 also fastens the fixed part 504 of the obstruction piece 500 to the bottom plate 150 of the outer casing 102.

In this invention, the holes 104 at the bottom section of the sidewalls 130a, 130b of the outer casing 102 are completely blocked by the obstruction pieces 504. When the side plate 108 is sucked up by the substrate due to thermal suction or electrostatic effect, the side plate 108 will collide with the obstruction piece 504 and returns to its original location. Hence, the side plate 108 is prevented from lodging inside the hole 104 to cause any damage to the substrate when the substrate is fetched from the cassette.

In summary, major advantages of this invention includes: 1. The holes at the bottom section of the sidewalls of the outer casing are blocked using obstruction pieces. This prevents the side plates from being sucked up by the substrate due to thermal suction or vacuum electrostatic effect and lodged inside the hole to cause damages to the substrate. 2. When the side plate is sucked up by the substrate due to thermal suction or electrostatic effect, the side plates will collide with the obstruction piece and returns to its original location. Hence, the side plates are prevented from lodging inside the hole to cause any damage to the substrate when the substrate is fetched from the cassette. 3. The cassette is able to hold substrates inside the load-lock with minimal damage. Therefore, product quality is improved and yield is increased.

In this embodiment, the most common substrate cassette (AKT design) design used by opto-electronic manufacturers is selected for the purpose of illustration. However, the scope of this invention should not be limited as such. In fact, the concept of blocking up the holes on the outer casing of a cassette with obstruction pieces to prevent the lodging of side plates into the hole can be applied to other types of cassettes as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A cassette for holding substrates inside a load-lock, comprising:
   an outer casing with a front surface having a plurality of slots and two sidewalls having a plurality of holes at a bottom section thereof;
   a plurality of braces positioned at corner edges inside the outer casing;
   a plurality of side plates fastened to the braces, wherein the side plates are attached to the braces at a position that corresponds to each slot; and
   a plurality of obstruction pieces positioned inside the outer casing corresponding to the holes at the bottom section of the sidewalls of the outer casing, wherein each obstruction piece comprises a fixed part and an obstructing part, the fixed part attaches firmly to a bottom plate of the outer casing, and the obstructing part blocks the corresponding hole.

2. The cassette of claim 1, wherein the cassette further comprises a plurality of horizontal screw sets, each set of horizontal screws engages with the bottom plate of the outer casing near the corresponding hole.

3. The cassette of claim 2, wherein each set of horizontal screws fastens the fixed part of each obstruction piece to the bottom plate of the outer casing.

4. The cassette of claim 1, wherein the obstruction pieces are L-shaped.

5. The cassette of claim 1, wherein the holes on the bottom section of the sidewalls of the outer casing are rectangular.

6. The cassette of claim 1, wherein the braces are set up on all four corners inside the outer casing and the side plates are attached to all four braces and correspond with each slot on the same horizontal plane.

7. The cassette of claim 6, wherein the four side plates corresponding to each slot support corners of a substrate.

* * * * *